(12) United States Patent
Branch et al.

(10) Patent No.: US 6,609,838 B1
(45) Date of Patent: Aug. 26, 2003

(54) REMOVABLE SMALL FORM FACTOR FIBER OPTIC TRANSCEIVER MODULE CHASSIS

(75) Inventors: Scott M. Branch, Rochester, MN (US); David Peter Gaio, Rochester, MN (US); William K. Hogan, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/489,870

(22) Filed: Jan. 20, 2000

(65) Prior Publication Data (65)

(51) Int. Cl.[7] .................................................. G02B 6/00
(52) U.S. Cl. ......................... 385/92; 361/752; 439/76.1
(58) Field of Search ............................ 439/76.1; 385/88, 385/92; 361/752, 740, 759

(56) References Cited

U.S. PATENT DOCUMENTS 4,092,698 A * 5/1978 Brefka ........................ 361/752
5,069,522 A * 12/1991 Block et al.
6,179,627 B1 * 1/2001 Daly et al. .................. 439/76.1

* cited by examiner

*Primary Examiner*—Neil Abrams
(74) *Attorney, Agent, or Firm*—Allen, Dyer, Doppelt, Milbrath & Gilchrist, P.A.

(57) ABSTRACT

An easily removable modular optical signal transceiver unit for conversion between modulated light signal transmission and electronic data signals and which conforms to the Small Form Factor standard for transceiver interfaces is disclosed. The structural details of its chassis include aspects which insure the proper positioning of electronic circuit boards of a transmitter optical subassembly and a receiver optical subassembly as well as the positioning of electromagnetic radiation shielding on the chassis. In conjunction with an interface device on an electronic circuit board of a host device, the chassis supports electromagnetic radiation shielding which substantially encloses the sources of electromagnetic radiation within the module and suppresses the escape of electromagnetic radiation, thereby preventing electromagnetic interference with sensitive components and devices in proximity to the module. During assembly, the chassis side walls are deflected, so that electronic or electro-optic components can pass over latching surfaces into contact with positioning surfaces for retaining the components in their assembled positions.

11 Claims, 9 Drawing Sheets

REMOVABLE SMALL FORM FACTOR FIBER OPTIC TRANSCEIVER MODULE CHASSIS

CROSS REFERENCE TO RELATED APPLICATIONS

This application is related to:

U.S. Pat. No. 6,074,228 issued Jun. 12, 2000, entitled GUIDE RAIL AND CAM SYSTEM WITH INTEGRATED CONNECTOR FOR REMOVABLE TRANSCEIVER, by Jerry Berg, David P. Gaio and William K. Hogan;

U.S. Pat. No. 6,459,517 issued Oct. 1, 2002, entitled ENHANCED ELECTROMAGNETIC INTERFERENCE SHIELD, by Timothy Duncan, John Maas, James L. Peacock and Scott Thorvilson;

U.S. Pat. No. 6,407,932 issued Jun. 18, 2002, entitled ELECTROMAGNETIC INTERFERENCE SHIELD AND GROUND CAGE, by David P. Gaio, William K. Hogan and Paul Sendelbach;

U.S. patent application Ser. No. 09/391,974, filed Sep. 8, 1999, entitled GUIDE RAIL AND CAM SYSTEM WITH INTEGRATED LOCK-DOWN AND KICK-OUT SPRING FOR SMT CONNECTOR FOR PLUGGABLE MODULES, by David P. Gaio, William K. Hogan, Frank Ovanessians and Scott M. Branch;

U.S. Pat. No. 6,302,596 issued Oct. 16, 2001, entitled SMALL FORM FACTOR OPTOELECTRONIC TRANSCEIVERS, by Mitch Cohen, Jean Trewhella, David P. Gaio, William K. Hogan, Miles Swain, Phil Isaacs and Pat McKnite;

U.S. Pat. No. 6,485,322 issued Nov. 16, 2002, entitled REMOVABLE LATCH AND BEZEL EMI GROUNDING FEATURE FOR FIBER-OPTIC TRANSCEIVERS, by Scott M. Branch, David P. Gaio, and William K. Hogan; and, U.S. Pat. No. 6,335,869 issued Jan. 1, 2002, entitled, REMOVABLE SMALL FORM FACTOR FIBER OPTIC TRANSCEIVER MODULE AND ELECTROMAGNETIC RADIATION SHIELD, by Scott M. Branch, David P. Gaio and William K. Hogan, all of said applications being commonly assigned herewith and all of which are incorporated by reference herein in their entireties, for purposes of disclosure.

THE FIELD OF THE INVENTION

This invention relates to the simple fabrication of removable electronic interface modules for connecting fiber optic communication or signal lines to a computer and, more specifically, to the chassis structure which permits efficient and reliable assembly of both the interfacing module electronic components and the shielding of the module to prevent, to the maximum extent possible, electromagnetic radiation from escaping the module.

BACKGROUND OF THE INVENTION

Computers increasingly are being connected to communications lines and other devices or networks with the computers performing as servers to the peripherally connected computers or devices. The volume of data sent and received by the computer serving as a server of a network is such that the networks are advantageously constructed using fiber optic lines in order to increase the throughput of data. Fiber optic lines and the associated fiber optic signals require transceivers to convert the optical light pulse signals to electronic signals which are usable by the computer. Such a transceiver includes a transmitter optical subassembly and a receiver optical subassembly to send and receive the optical signals.

Industry standards have been established to define the physical parameters of the said devices and, particularly, the overall interface. This permits the interconnection of different devices manufactured by different manufacturers without the use of physical adapters.

Since about 1990, the fiber optic industry has been using a so-called "SC duplex fiber optic connector system" as the optical fiber connector interface on the front of fiber optic transceivers. The physical separation between the transmitter optical subassembly and receiver optical subassembly (TOSA and ROSA, respectively) for the SC duplex connector is approximately 12.7 mm. However, the industry is now converting to the so-called "Small Form Factor optical connectors" and associated "Small Form Factor optical transceiver." In the so-called Small Form Factor optical connectors, the separation between the transmitter optical subassembly and receiver optical subassembly is established at approximately 6.25 mm, less than half the separation of the prior SC duplex connector. The Small Form Factor (SFF) standard establishes a module enclosure, having a 9.8 mm height and a width of 13.5 mm and allows a minimum of 24 transceivers arranged across a standard rack opening. The reduction in size from the former SC duplex connector standard to the Small Form Factor standard requires both substantial redevelopment and redesign.

Moreover, the Small Form Factor optical fiber connector interface has been adopted as a standardized removable module. The module may be connected to a module interface on the host circuit board of a computer. The transmitter optical subassembly/receiver optical subassembly in the module of the Small Form Factor optical fiber connector interface, the processor, and all long conductors of the transmitter optical subassembly and receiver optical subassembly, individually and collectively, radiate electromagnetic radiation and create electromagnetic interference for other electronic devices and components which are exposed to the electromagnetic radiation.

The use of a separate removable module containing a variety of electronic devices requires that the module be easily and inexpensively assembled and that the module further provide its own electromagnetic radiation shielding. Due to the size constraints placed on the interface modules, the shielding must be small but at the same time efficient in collection and grounding of the collected electromagnetic radiation.

OBJECTS OF THE INVENTION

It is an object of the invention to simplify assembly of a modular interface for receiving and sending optical data signals.

It is another object of the invention to provide a chassis for an optical interface for data signals whereby the structural characteristics of the chassis permit assembly at precise locations for the electronic components and the shielding permits both accurate connection to the host circuit board and proper alignment of the interface optical subassemblies with the connected optical fibers.

It is a further object of the invention to provide reliable assembly of a plurality of parts and components into a module for translation of the data signals between electrical and optical form.

It is still another object of the intention to make the module easily removable from the host device as well as effectively suppress electromagnetic radiation to the greatest extent possible.

SUMMARY OF THE INVENTION

A module for interfacing communication line or lines to the main system of the computer is designed to be removable. In order to provide the removability factor, the module must contain sufficient electronic circuitry to convert signals between optical fiber conveyed light pulses and electrical digital signals or vice-versa. This conversion requires at least a laser driver, post amplifier, and supporting circuitry as well as transmitter optical subassembly and a receiver optical subassembly which comprise light generating and light sensitive electronic devices, respectively. The operation of the electronics causes radiation of electromagnetic energy which may cause interference, if not suppressed, with nearby electromagnetic radiation sensitive equipment and components.

An easily removable module is advantageously assembled on a chassis which is molded plastic, preferably, selected for its durability and insulative characteristics. The chassis has an open channel structure for a portion of its length, and a duplex port receiving end for accepting fiber optic conductor connectors. The chassis is formed to include positioning surfaces against which an electronic circuit board is positioned, and a pair of locating pins or projections define the position of the electronic circuit board relative to the chassis.

In areas lacking additional stabilization, the walls of the chassis are formed thinly enough that the walls may be deflected to permit snap-in positioning of the circuit board within the chassis and allow retention latches to be forced out of the path of a circuit board once inserted into the chassis.

Once assembled, the chassis then is substantially enclosed with shielding to suppress the escape of electromagnetic radiation. The shield is fabricated of electrically conducting sheet metal, such as thin metal plate stock, and formed into a channel shape. The channel shaped shield is provided with edge tabs. Each edge tab may be bent to form spring contacts which contact and electrically ground to a bracket or frame member; additionally, tabs may be bent over walls of the chassis to retain the shielding in its desired position. A separate shielding member is positionable on the chassis and retainable by bending or crimping of the edge tabs as contact between the separate shield and the edge tabs establishes grounding electrical contact therebetween. The emissions of electromagnetic radiation from the duplex port end of the chassis are reduced and modified by extending a shield member between the transmitter optical subassembly/receiver optical subassembly, bridging the separate shield and the channel shaped shield to reduce the effective opening to attenuate the electromagnetic radiation passing through the duplex port end of the chassis.

However, it is known that an aperture will attenuate electromagnetic radiation waves when the aperture is less than ½ of the wavelength λ to be attenuated (i.e., length of aperture >½λ). Moreover, the smaller the aperture, the greater the attenuation of the electromagnetic radiation waves. The attenuation of electromagnetic radiation waves due to passage through an aperture can be determined using the following formula:

$S=20 \log(\lambda/2L)$, where

S=the shielding effectiveness of the aperture (in decibels);
λ=the wavelength of the electromagnetic radiation; and
L=the maximum linear length of the aperture (in meters).

Moreover, the wavelength λ can be determined by dividing the velocity of the electromagnetic radiation wave (i.e., the wave speed, which is approximately $3 \times 10^8$ m/sec$^2$) by the frequency of the electromagnetic radiation emissions.

Thus as the operational frequency (and hence, speed) of an electrical device increases, the associated wavelengths become smaller, thus requiring smaller apertures. However, the apertures are typically limited in minimum size to allow for the passage of associated cables or connections, for example. If the size of the apertures are reduced too much, then passage of the associated cables or connections therethrough may be prohibited. Therefore, it is clear that the size of the aperture, which typically has a minimum size, may limit the speed (i.e., bandwidth) of the associated electrical device.

A more complete understanding of the invention may be had from the detailed description of the invention that follows and the attached drawings.

DETAILED DESCRIPTION

Figure 1:
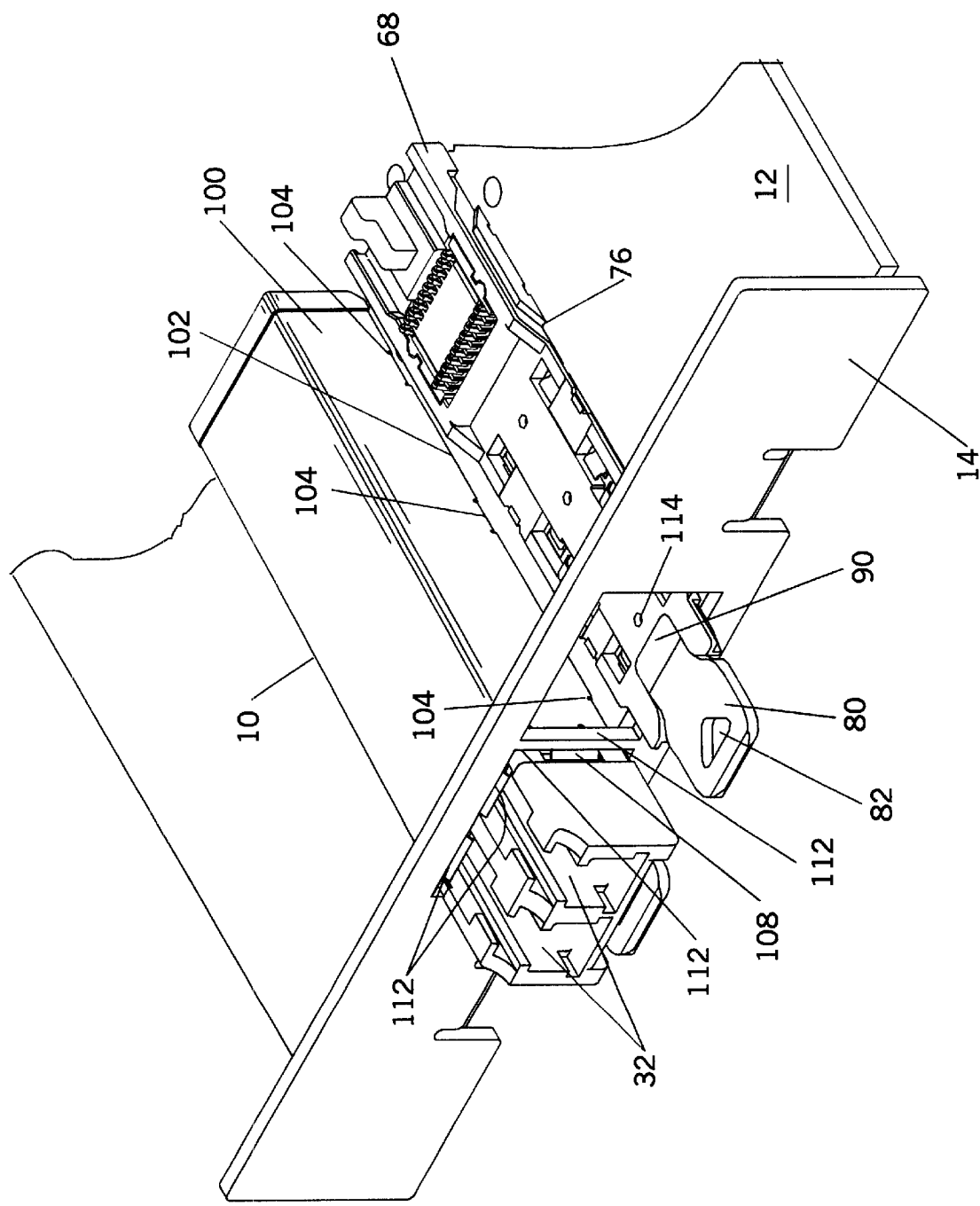
FIG. 1 is an elevated right perspective view of a host device circuit board, connection interface, and the insertable/removable transceiver module of the invention.

OF THE PREFERRED EMBODIMENT OF THE BEST MODE OF IMPLEMENTING THE INVENTION AS CONTEMPLATED BY THE INVENTORS

An insertable and removable electronic module is illustrated in the various figures of the drawings. The preferred type module is a duplex transceiver module incorporating a transmission optical subassembly and a receiver optical subassembly, also sometimes referred to as TOSA and ROSA, respectively.

Computers and particularly those computers which act as and are used as servers and controllers for networks are connected to communication lines which, in turn, are typically connected to other devices such as modems or other computers either directly or through other network connection lines.

Many connections between peripheral computers and servers are now being made through the use of fiber optic cable. Fiber optics present completely different requirements for interconnection to the electronic circuits and the previously widely used copper wire cable connections. The optical fiber must connect or interface with a light actuated diode or a light emitting diode which convert some incoming light signals into electrical signals and outgoing electronic signals to modulated light signals.

Although this description is made with reference to any or all of the drawing figures, in certain instances, references may be made to specific figures. An element of the disclosed module 10 may be observed in more than one figure.

In FIG. 1, a module 10 permitting easy connection of the optical fibers is illustrated mated to a host electronic circuit board 12. The electronic circuit board 12 is attached to a mounting bracket 14 which serves as a portal for insertion of the module 10, representing the machine frame or bezel. The mounting bracket 14 typically is connected to an electrical machine ground (not shown).

Figure 3:
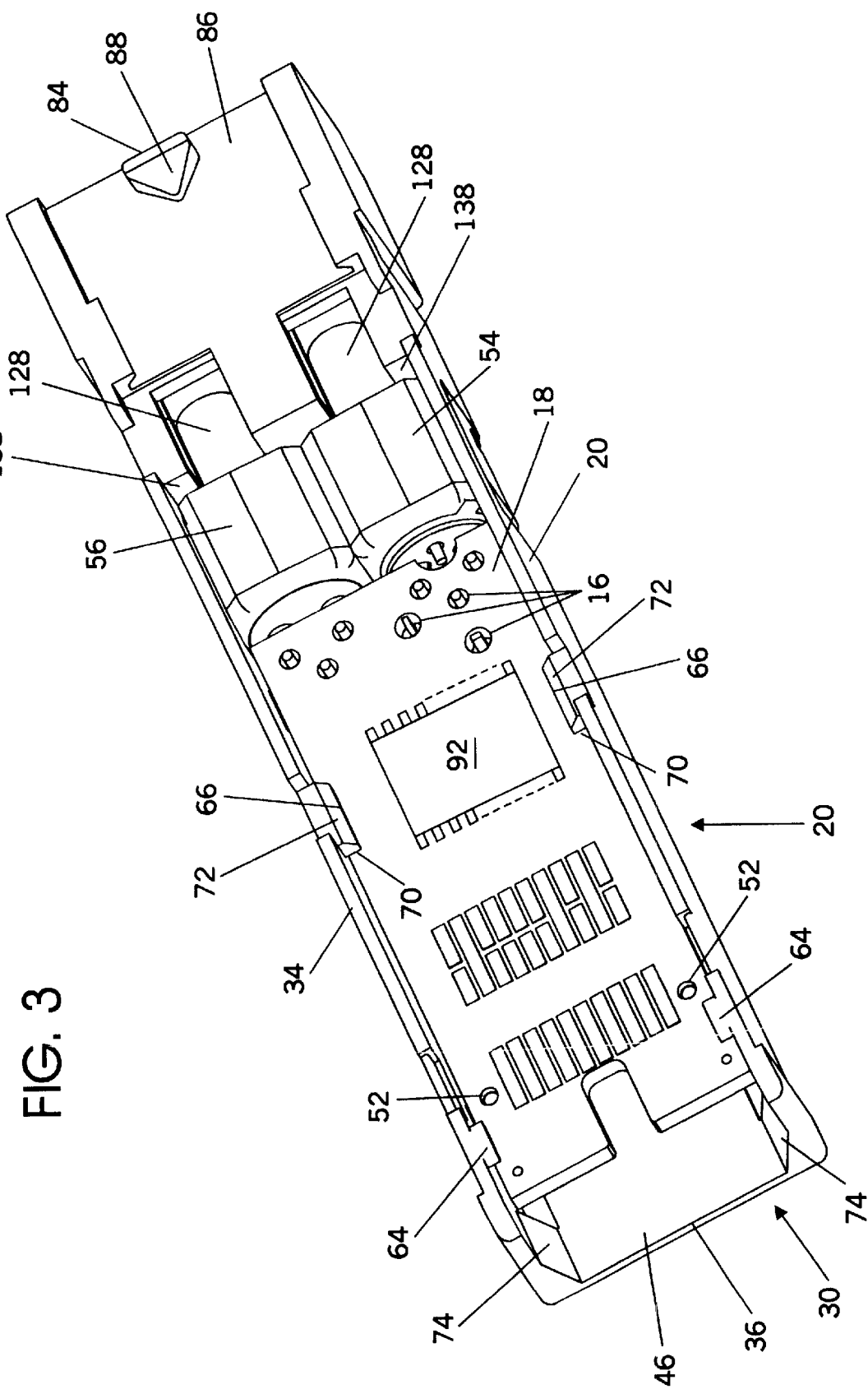
FIG. 3 is a depressed perspective view of an partially assembled transceiver module without the electromagnetic radiation shield.
Figure 3B:
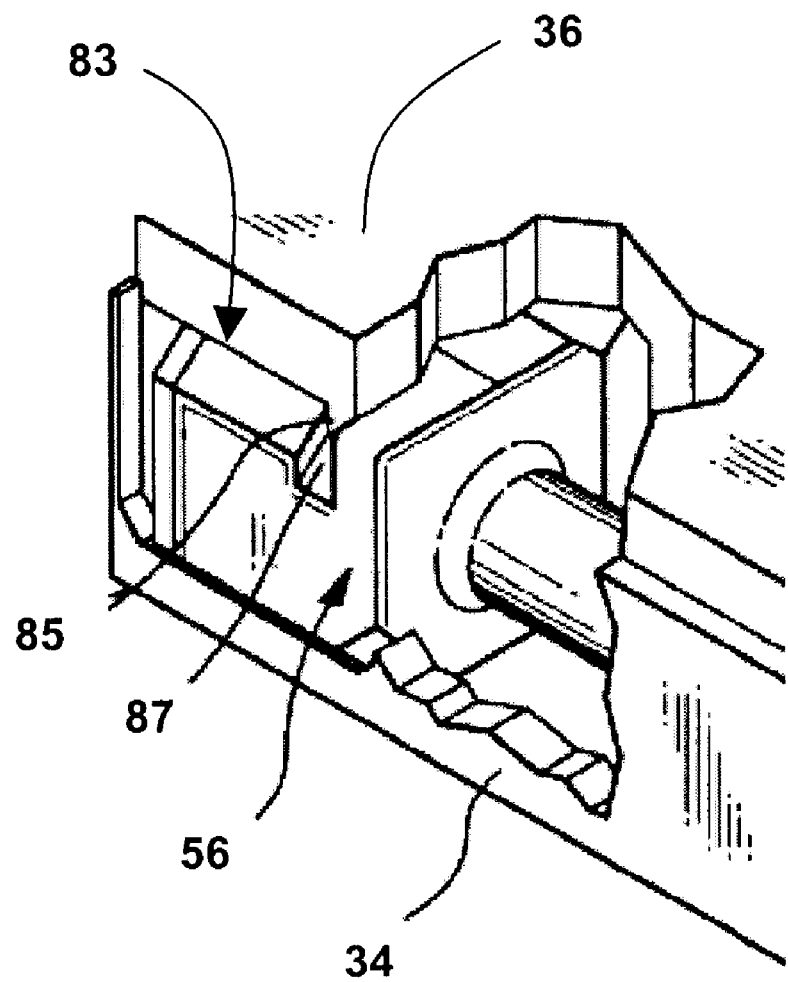
FIG. 3B is a partially cut away perspective view of the middle section of the module of the present invention.
Figure 4:
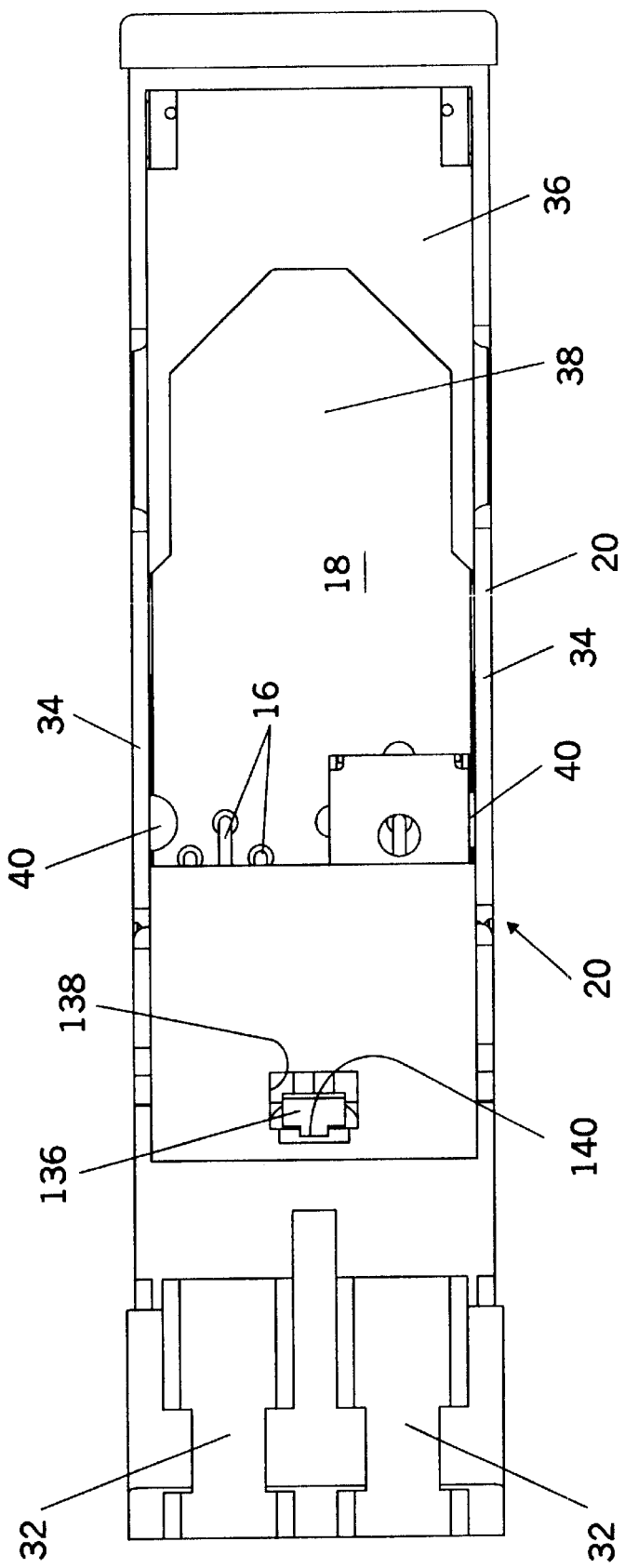
FIG. 4 is a top view of the module without the electromagnetic radiation shield.

Module 10 supports and encloses transmitter and receiver optical subassemblies 54 and 56, respectively, with electronic leads 16 electrically connected to a circuit board 18, as illustrated in FIGS. 3 and 4, by solder (not shown) or other effective and well known means. The receiver optical subassembly 56 functions to convert the incoming optical modulated light signals to electronic signals used by the computer or server (not shown). Similarly, the electronic signals from the host device are converted to modulated light pulses and presented to the end of the outbound optical fiber using the transmitter optical subassembly 54.

Circuit board 18 typically includes electronic elements that inherently propagate and radiate electromagnetic radiation. Electromagnetic radiation becomes electromagnetic interference when received by other electronic elements, components or devices either within the same host device (not shown) or other electronic devices within close proximity.

Figure 5:
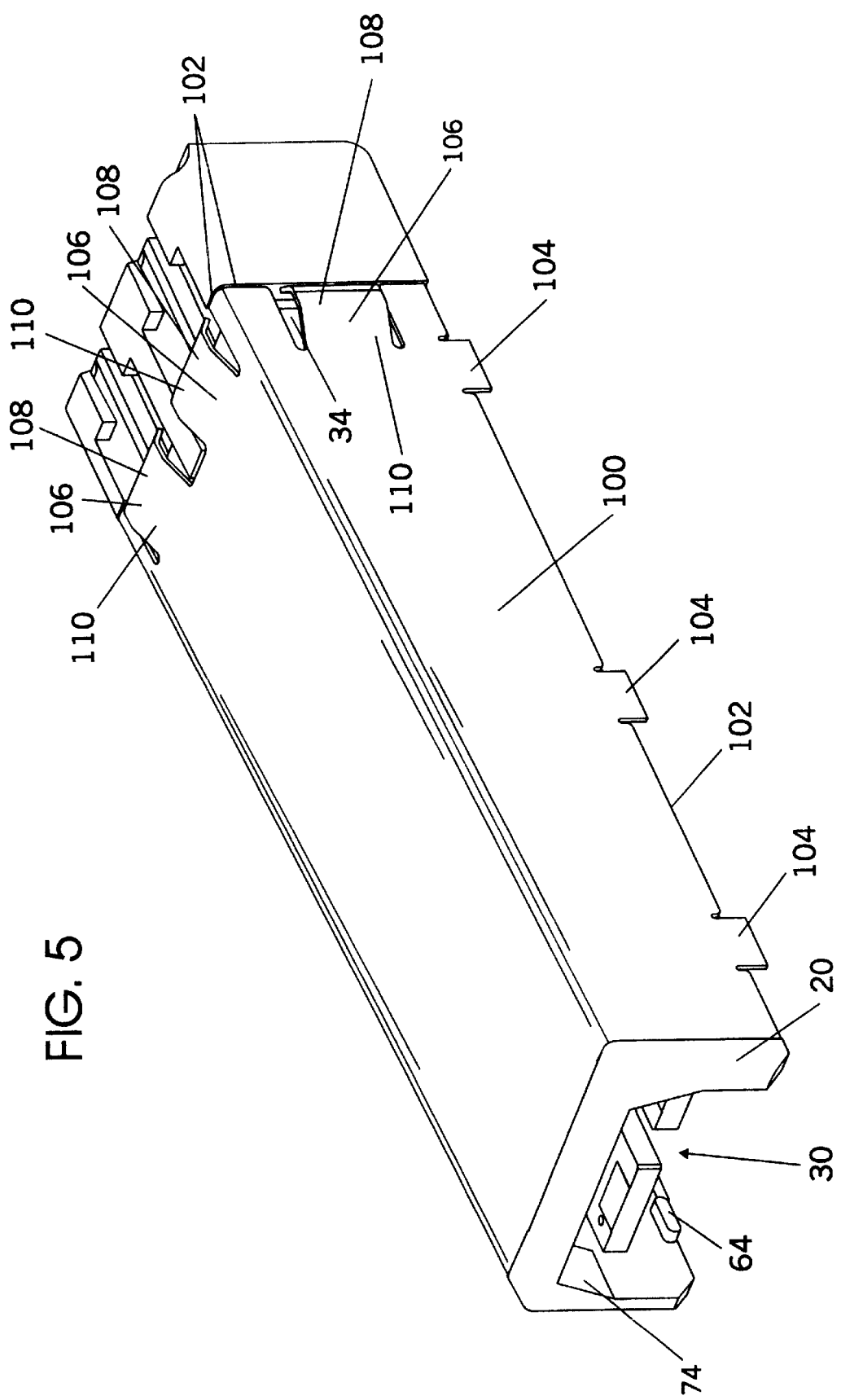
FIG. 5 is an elevated rear perspective view of the module of the invention with the electromagnetic radiation shield positioned but not completely installed on the chassis.
Figure 6:
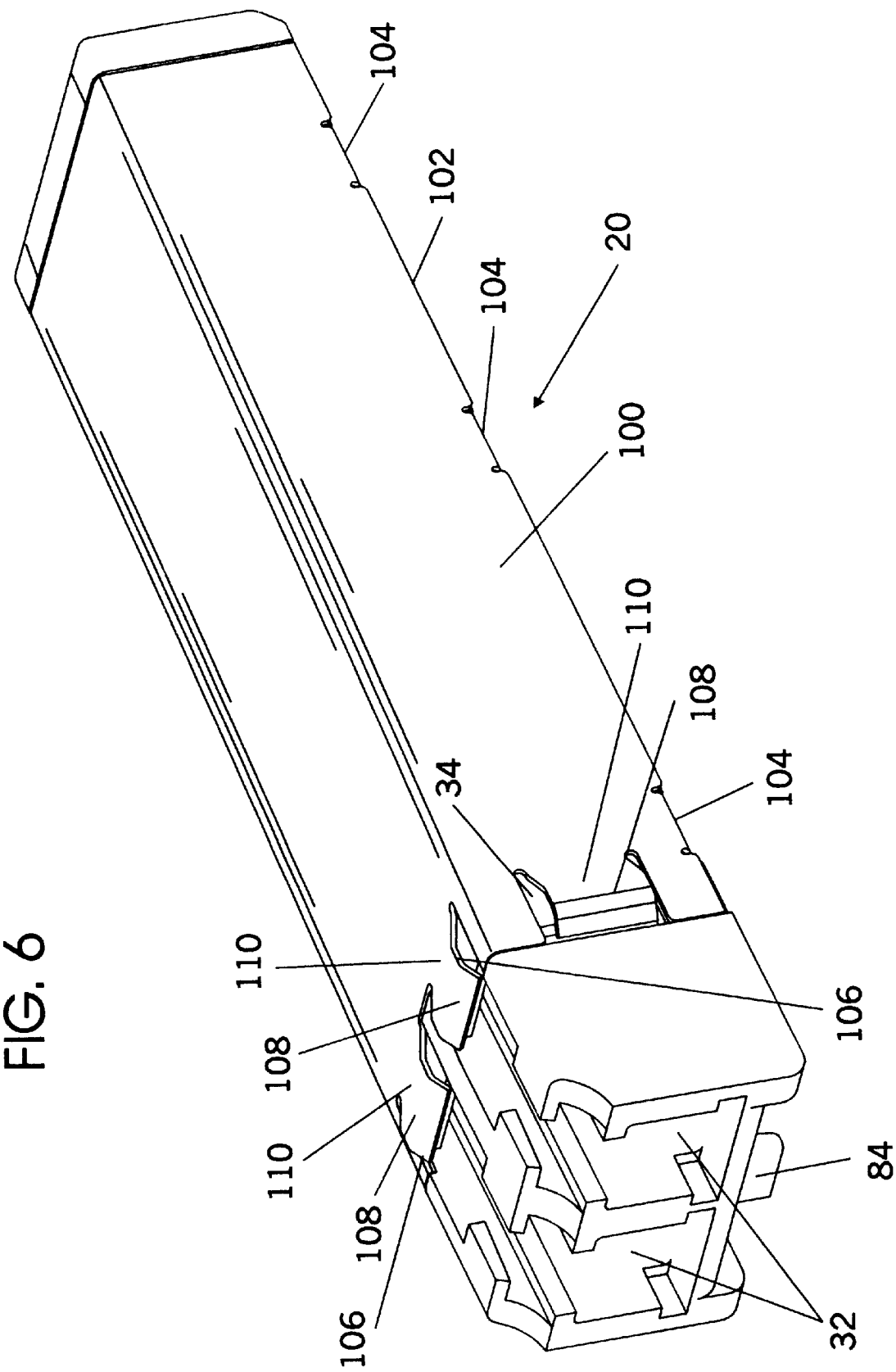
FIG. 6 is an elevated perspective view of the duplex connector of the end of the module partially enclosed by the electromagnetic radiation shield.

In order to provide electromagnetic radiation suppression to the greatest extent possible, an electrically conductive shield 100 (as shown in FIGS. 1, 5 and 6) and separate shield 120 (in FIGS. 7 and 8) are used to absorb the electromagnetic radiation and conduct the resulting electrical current to electrical ground. The more complete the enclosure of the electromagnetic radiation source, the more effective the suppression of the electromagnetic radiation.

Figure 2:
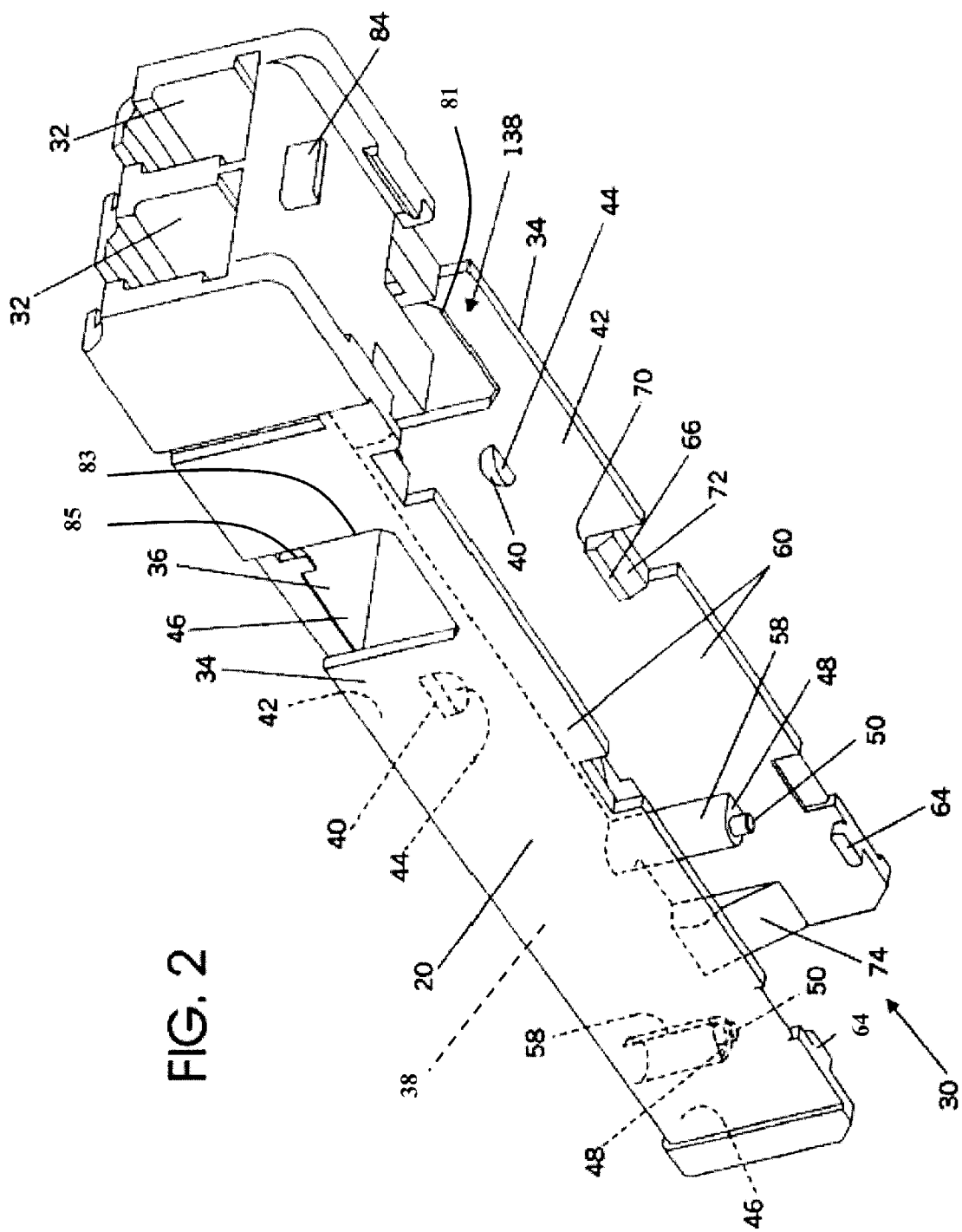
FIG. 2 is a depressed perspective view of a portion of the interior of the module chassis of the invention.

As illustrated in FIGS. 2, 3 and 4, the module chassis 20 supports and contains an electronic circuit board 18. Electronic circuit board 18 is illustrated in only a partially populated state; note, it should be understood that the exact circuits and precise population of circuit board 18 are not part of the invention except for specifically described and illustrated components, and that the circuitry 16 may be any useful circuit elements requiring shielding.

The module chassis 20 is generally a parallelepiped shaped structure, although two sides may be sloped toward each other if desired. The module chassis 20 is preferably formed of an insulative material such as a non-conductive molded plastic. The module chassis 20 forms a box-like structure with one substantially open end 30 and an opposing end forming duplex receptacles 32. Side walls 34 are formed integral with the top wall 36 which may be provided with an opening 38. While not required, the opening 38 in the top wall 36 facilitates assembly of the circuit board 18 into the chassis 20. The opening 38 increases the deflectability of the side walls 34 and permits an easier assembly of the module chassis 20 and circuit board 18, which involves the insertion and positioning of circuit board 18 into chassis 20.

FIG. 2 illustrates side walls 34 of the chassis 20 provided with protrusions 40 on interior surfaces 42 thereof. The protrusions 40 form positioning or stop surfaces 44 which may be engaged by a circuit board 18. Additionally, supported by the interior surface 46 of top wall 36 and interior surface 42 of the side walls 34 is a further positioning surface 48 or stop surface 48 and a locating pin 50 extending from the stop surface 48. Locating pin 50 mates with locating hole 52 in circuit board 18, as best observed in FIG. 3, to precisely define the position of circuit board 18 relative to the long axis of module chassis 20.

As may be best observed in FIG. 3, locating pin 50 insures that circuit board 18 is properly positioned within chassis 20 so that the optical interfaces 128 of the transmitter optical subassembly 54 and receiver optical subassembly 56 are properly disposed to align and be properly spaced relative to connectors terminating optical fibers (not shown) once inserted into duplex ports 32.

As viewed in FIG. 2, chassis side walls 34 and top wall 36 are stabilized relative to each other by a support 58 joining side walls 34 and top wall 36 and forming positioning surface 48. While the chassis structure 20 is stabilized in the region of supports 58, the mid-sections 60 of side walls 34 remain unstabilized.

FIGS. 2 and 3 illustrate side walls 34 which include additional projections 64, 66. The projections 64 serve as guide lugs 64 engagable with channel 76 of the interface connection device 68 attached to circuit board 12 in FIG. 1. The guide lugs 64 as seen in FIGS. 2, 3, 5 and 8 must be maintained at a controlled spacing from each other to insure that the chassis 20 does not disengage from interface connection device 68 whenever mounted thereon. Additional stability of the side walls 34 at the open end 30 is provided by fillets 74, preventing further undesirable spreading of guide lugs 64. Similarly, the attachment of the support 58 to the side walls 34 and the top wall 36 along with the engagement of pins 50 in holes 52 of circuit board 18 further prevents undue spread of guide lugs 64 and latches 66.

Continuing reference to FIGS. 2 and 3, projections 66 form latch members 66 with latch surfaces 70 spaced by the thickness of an electronic circuit board 18 from the plane formed by stop surfaces 44 and 48. Latches 66 are conveniently provided with a champhered surface 72 to ease the passage of the electronic circuit board 18 past latches 66 upon being inserted into chassis 20. For assembly purposes, the side walls of 34 are subject to deformation or deflection in the region of the latches 66. Sidewalls 34 may be spread to remove latches 66 from interference with an electronic circuit board 18. Similarly, circuit board 18 may be released and removed from chassis 20 by spreading side walls 34 and latches 66.

During assembly, while the side walls 34 are deflected, the transmitter optical subassembly 54 and the receiver optical subassembly 56 are also inserted into the module chassis 20. Apertures 81 and 83 are provided in the mid-sections 60 of side walls 34 for engaging the transmitter optical subassembly 54 and the receiver optical subassembly 56, respectively, thereby retaining the optical subassemblies 54 and 56 in an assembled position. Projections 85 (FIG. 2, only one shown) extend from the interior surface 46 of the top wall 36 for engaging slots 87 (see FIG. 7) in the transmitter and receiver optical subassemblies 81 and 83, respectively, to ensure stability and provide proper alignment thereof in the assembled position.

As the fully assembled module 10 is inserted into the host apparatus, as best viewed in FIG. 1, the module 10 is retained in the host device by a retainer 80 which has a latching aperture 82 formed therein. Latching aperture 82 is positionable surrounding retainer lug 84, best illustrated in FIG. 3, on the bottom wall 86 of chassis 20. Retaining member 80 is formed with a surface configuration (not shown) on the underside thereof that meets with a complementary, interlocking surface configuration (not shown) on the interface connection device 68. The retaining member 80 may be depressed to release lug 84 and raised to engage and retain lug 84. Bottom surface 86 of the chassis 20 engages the inner end 90 of retainer 80 and biases it so that aperture 82 seats around lug 84. The inward portion 88 of lug 84 is inclined to cam retainer 80 past retainer lug 84.

Refer now to FIGS. 1, 3, 5, 6, 7 and 8. In order to prevent the leakage or escape of electromagnetic radiation from the electronic elements and, specifically, electronics 92 and well as other circuitry within the module 10 and similar electronic components (not shown), it is necessary to shield the electronics 92 and any similar electronic components (not shown) with an electromagnetic radiation shield 100 and bottom shield 120. FIG. 1 shows the module 10 with the electromagnetic radiation shield 100 enclosing portions of three sides of module chassis 20.

Electromagnetic radiation shield 100 may be fabricated from any desired sheet metal material but preferably from a thin sheet nickel-silver stock, chosen for its relatively high rigidity and high electrical conductivity. The shield 100 must conduct the electrical current created by the electromagnetic radiation collected within the shield 100 sheet material.

The sheet metal material is punched or cut to the desired shape and bent to form a channel as well as form other details and structure of the shield 100. Along the edges 102 of the shield 100 are formed a plurality of tabs 104 and 106. Tabs 104 are deformed during assembly to retain shield 100 on chassis 20.

Tabs 106 are formed creating smooth bends resulting in a contact area 108 for progressively engaging a portion of the host device, such as the mounting bracket 14. Tabs 106 are formed during the stamping process or as supplemental operations and bent to project the contact area 108 away from the chassis 20. The sloping surface 110 on tabs 106 acts as a cam and first engages mounting bracket 14, forcing the tabs 106 to flex and thus act as a beam spring. The deflection of tabs 106 flexes the contact surface 108 toward the chassis 20 and creates a restore force which firmly holds contact surface 108 against the inside edge 112 of the opening 114 in mounting bracket 14, establishing an electrical contact between the shield 100 and the mounting bracket 14, thus grounding shield 100 through mounting bracket 14, and into a connection to machine ground (not shown).

To at least partially enclose the bottom of chassis 20 with an electromagnetic radiation shield, a generally flat piece 120 of conductive sheet metal is cut to extend across the open side of chassis 20, and so extending to the extent possible without blocking or interfering with connections between the electronic circuit board 18 and the connection device attached to circuit board 12. The bottom shield 120 is best illustrated in FIGS. 7 and 8.

Bottom shield 120 is further formed to include tabs 122 which are spaced apart on each side edge 126 by the same distance as two of the tabs 104 are spaced apart on an edge of bottom shield 120. The tabs 122 are formed or bent to extend away from the electronic circuit board 18 and parallel to the side walls 34 of chassis 20. Upon assembly, the tabs 122 will ultimately be trapped by and electrically connected with some of tabs 104 on shield 100. The tabs 104 will overlie tabs 122 and the interlocking will retain shield 120 in place relative to chassis 20.

The end 124 of shield 120, which is disposable adjacent to transmitter optical subassembly 54 and receiver optical subassembly 56, is formed with a plurality of tabs 134 and 136. Tabs 134 cover the transmitter optical subassembly 54 and receiver optical subassembly 56 and, particularly, the opening 138 in chassis 20 in FIG. 2 into which the transmitter optical subassembly 54 and receiver optical subassembly 56 are inserted. This shielding structure provides a barrier to electromagnetic radiation escape in that region of chassis 20.

Figure 7:
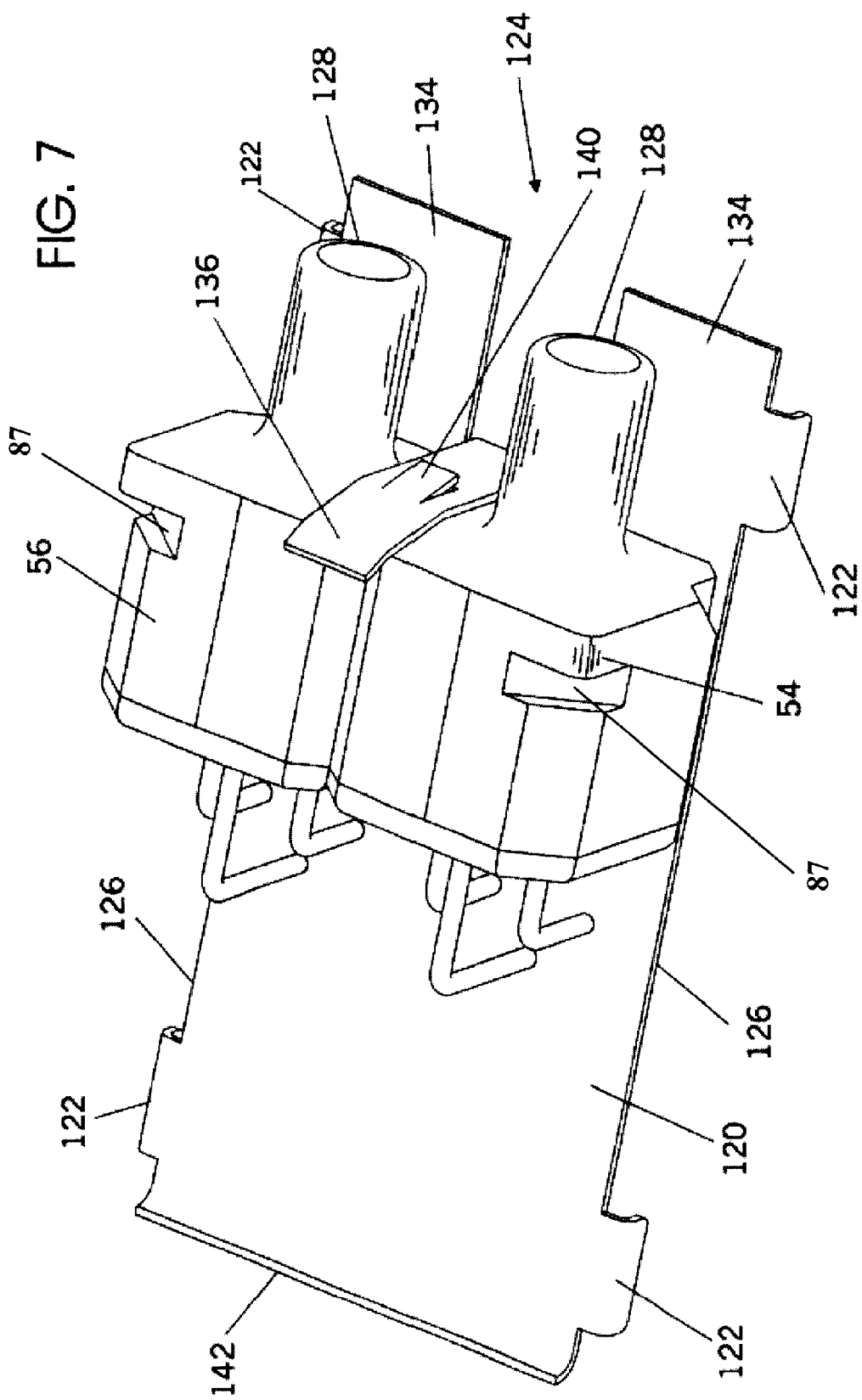
FIG. 7 is an elevated perspective view of the separate bottom electromagnetic radiation shield and its position relative to the transmitter optical subassembly and receiver optical subassembly of the invention.
Figure 8:
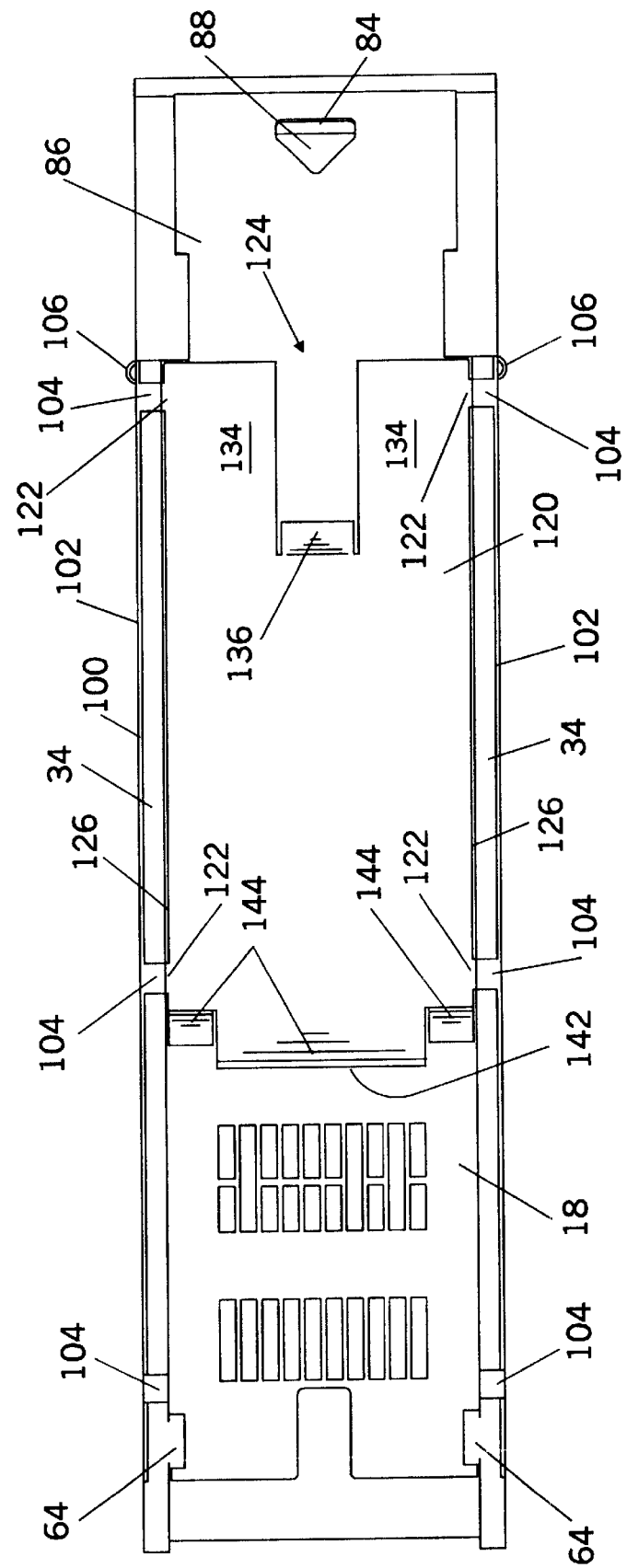
FIG. 8 is a bottom view of the module with the bottom electromagnetic radiation shield installed, leaving exposed contacts for connection with the interface connection on the host circuit board.

Referring to FIG. 7, end 124 of the shielding 120 is cut to form an appendage 136 between tabs 134 and is bent or otherwise formed to project generally perpendicularly to the plane of shield 120. This appendage 136 is interdigitated between the transmitter optical subassembly 54 and receiver optical subassembly 56. Appendage 136 is long enough to extend completely through an opening 138 in chassis 20 (shown in FIGS. 4 and 8) and engage the interior surface of shield 100. The engagement of the appendage 136 with the interior surface of shield 100 provides a redundant electrical connection between shield 100 and shield 120.

Of further significance is the positioning of the appendage 136 intermediate the otherwise open duplex ports 32 of chassis 20, thereby forming two openings through which the electromagnetic radiation may escape. The open duplex ports 32 of chassis 20 cannot be totally sealed to electromagnetic radiation escape due to the need to connect fiber optic strands to the electronic circuit boards 18 and particularly to the circuitry. If an opening is reduced in size, the electromagnetic radiation escaping through the reduced opening is rendered less interfering; passing through the reduced size hole attenuates the electromagnetic radiation passing through the end of the chassis 20, thereby minimizing the deleterious effects of the escaping radiation. Accordingly, the appendage 136 is made as wide as possible while fitting between the transmitter optical subassembly 54 and receiver optical subassembly 56 connector alignment portions 138.

The appendage 136 may be further provided with a punched and projecting tab 140 which makes contact with the plastic chassis 20 and serves to prevent the shield 120 from deforming when shield 100 deflects and compresses appendage 136.

As viewed in FIG. 7, the end 142 of shield 120, opposite end 124, is preferably formed into at least one section deviating from the plane of the shield 120 in a direction toward electronic circuit board 18. End 142 will engage circuit board 18 and further close escape paths for electromagnetic radiation from electronics 92 or other electronic devices or conductors radiating electromagnetic emissions. Additionally, the bending or forming of shield 120 near its end 142 adds rigidity to the shield 120 and reduces deflection of shield 120 which may otherwise cause contact with electronic components or conductors and a possible short. If desired, the electronic circuit board 18 may be designed with contact pads (not shown) connecting to the ground plane (not shown) of the electronic circuit board 18 and the contact pads disposed to be engaged by edge 142 of shield 120. This additional ground contact forms further redundancy in grounding shield 120.

As illustrated in FIG. 8, the end 142 of shield 120 may be formed into multiple formed tabs 144 of varying lengths and widths, if desired.

As illustrated in FIGS. 1, 6 and 8, crimping tabs 104 around the edges of side walls 34 of chassis 20 and trapping tabs 122 on shield 120 supplies additional rigidity and stability to side walls 34, particularly in the region of latch members 66, thereby preventing inadvertent spreading of latches members 66. The interlocking nature of the shield 100 and shield 120 renders the module very rigid.

Because the transmitter optical subassembly 54, receiver optical subassembly 56 and the associated electronics 92 are all contained in the removable module 10, the easy removability of module 10 aids greatly in the event of a component failure and makes replacement quick and simplified and permits a rapid return to service of the host device. Module 10 is hot pluggable and can be inserted and removed without turning off the power supplies within the host machine. Similarly, if the communications lines are copper wire or coaxial cable, the transmitter optical subassembly 54 and receiver optical subassembly 56 would be incompatible, easily replaced with a substitute module and the appropriate interface circuitry inserted. Of necessity, the substitute module still will require a electromagnetic radiation shielding similar to that disclosed herein.

Although the dimensional parameters of the module 10 are established by the so-called "Small Form Factor" standard for transceiver modules for optical fiber interfaces, the construction and implementation details of the module 10 are left to designers of the particular system into which the module 10 will be incorporated. Accordingly, one of ordinary skill in the art will understand that minor modifications and changes may be made to the details of chassis 10 and of the electromagnetic radiation shielding 100, 120 without removing the module from the scope of protection afforded by the attached claims.

We claim:

1. A fiber optic transceiver module comprising:
    a preformed chassis having a bottom wall, first and second side walls, and a top wall; said preformed chassis including a mating region therein for accepting a connector;
    an electronic circuit board; and
    a transmitter optical subassembly and a receiver optical subassembly electrically connected to said electronic circuit board;
    wherein said chassis further includes retainer surfaces for positioning and retaining said electronic circuit board;
    wherein said retainer surfaces include a plurality of abutment surfaces and a plurality of latching surfaces;
    wherein said first and second sidewalls deflect to permit passage of said electronic circuit board past said latching surfaces and against said abutment surfaces.

2. The fiber optic transceiver module of claim 1, wherein said electronic circuit board further comprises at least one position defining hole; and wherein a first one of said abutment surfaces further comprises a projection insertable into said position defining hole in said electronic circuit board.

3. The fiber optic transceiver module of claim 2, wherein said first abutment surface is supported by one of said first and second side walls.

4. The fiber optic transceiver module of claim 3, wherein said projection projects substantially parallel to said side wall supporting said first abutment surface.

5. The fiber optic transceiver module of claim 2, wherein said latching surfaces project from said side walls; and wherein said side walls return to a position in which said latching surfaces block removal of said electronic circuit board to prevent disengagement of said electronic circuit board from said abutment surfaces.

6. A fiber optic transceiver module comprising:
    a preformed chassis having a bottom wall, first and second side walls, and a top wall; said preformed chassis including a mating region therein for accepting a connector;
    an electronic circuit board; and
    a transmitter optical subassembly and a receiver optical subassembly electrically connected to said electronic circuit board;
    wherein said chassis further includes positioning surfaces engageable with said transmitter optical subassembly and said receiver optical subassembly to align said transmitter optical subassembly and said receiver optical subassembly with openings in one end of said chassis;
    wherein said openings receive connectors for positioning an optical fiber end juxtaposed to each of said transmitter optical subassembly and said receiver optical subassembly; and
    wherein said positioning surfaces comprise first and second apertures in said first and second sidewalls, respectively, for engaging said transmitter optical subassembly and said receiver optical subassembly, respectively, whereby during assembly said first and second sidewalls temporarily deflect to enable passage of said transmitter optical subassembly and said receiver optical subassembly into engagement with the apertures, thereby defining assembled positions of and retaining said transmitter optical subassembly and said receiver optical subassembly.

7. The fiber optic transceiver module according to claim 6, wherein the transmitter optical subassembly and the receiver optical subassembly include first and second slots, respectively; and wherein the chassis further includes first and second projections for insertion into said first and second slots, respectively, thereby providing additional retention means when assembled.

8. A duplex fiber optic transceiver module comprising:
    a structure having a plurality of walls forming a chamber, said chamber having an open end, an open side and an end structure opposite said open end; said end structure comprising a pair of cavities formed to accept insertion of optical connectors;
    a transmitter optical subassembly mounted in the structure for converting electrical signals from a host device into optical signals for transmission to a network;
    a receiver optical subassembly mounted in the structure for converting optical signals from the network into electrical signals for transmission to the host device;
    an electronic circuit board retained within said structure, said electronic circuit board connected to said transmitter optical subassembly and said receiver optical subassembly, which extend into said pair of cavities;
    wherein opposing ones of said walls of said structure further comprise positioning surfaces and latching surfaces, said opposing walls deflectable to permit passage of said electronic circuit board beyond said latching surfaces into contact with said positioning surfaces.

9. The duplex fiber optic transceiver module of claim 8, wherein opposing ones of said walls are further deflectable to accept passage of said transmitter optical subassembly and said receiver optical subassembly; and wherein said opposing walls restore to a retaining position relative to said transmitter optical subassembly and receiver optical subassembly.

10. The duplex fiber optic transceiver module according to claim 9, wherein each of said opposing walls includes an aperture for engaging one of said transmitter optical subassembly and said receiver optical subassembly, whereby said opposing walls temporarily deflect to enable passage of said transmitter optical subassembly and said receiver optical subassembly into engagement with the apertures, thereby defining assembled positions of and retaining said transmitter optical subassembly and said receiver optical subassembly.

11. The duplex fiber optic transceiver module according to claim 10, wherein the transmitter optical subassembly and the receiver optical subassembly include first and second slots, respectively; and wherein the structure further includes first and second projections for insertion into said first and second slots, respectively, thereby providing additional retention means when assembled.

* * * * *